US009900004B2

(12) United States Patent
Lu et al.

(10) Patent No.: US 9,900,004 B2
(45) Date of Patent: *Feb. 20, 2018

(54) RADIO FREQUENCY SWITCHING CIRCUIT WITH DISTRIBUTED SWITCHES

(71) Applicant: Peregrine Semiconductor Corporation, San Diego, CA (US)

(72) Inventors: Jianhua Lu, San Diego, CA (US); Peter Bacon, Derry, NH (US); Raul Inocencio Alidio, Carlsbad, CA (US); Vikram Sekar, San Diego, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/597,029

(22) Filed: May 16, 2017

(65) Prior Publication Data

US 2017/0324407 A1    Nov. 9, 2017

Related U.S. Application Data

(63) Continuation of application No. 14/995,023, filed on Jan. 13, 2016, now Pat. No. 9,685,946, which is a
(Continued)

(51) Int. Cl.
*H03K 17/687* (2006.01)
*H03K 17/10* (2006.01)
(Continued)

(52) U.S. Cl.
CPC ......... *H03K 17/687* (2013.01); *H03K 17/102* (2013.01); *H03K 17/693* (2013.01); *H04B 1/006* (2013.01); *H04B 1/44* (2013.01)

(58) Field of Classification Search
CPC .. H03K 17/687; H03K 17/693; H03K 17/102; H04B 1/006; H04B 1/44
See application file for complete search history.

(56) References Cited

U.S. PATENT DOCUMENTS 4,929,855 A * 5/1990 Ezzeddine ............... H01P 1/15
327/427
4,939,485 A    7/1990 Eisenberg
(Continued)

FOREIGN PATENT DOCUMENTS

EP    D424113    4/1991

OTHER PUBLICATIONS

Hiltunen, Thomas J., Office Action received from the USPTO dated May 19, 2016 for U.S. Appl. No. 14/995,023, 15 pgs.
(Continued)

*Primary Examiner* — Thomas J Hiltunen
(74) *Attorney, Agent, or Firm* — Jaquez Land Greenhaus LLP; Martin J. Jaquez, Esq.; John Land, Esq.

(57) ABSTRACT

An RF switching device having distributed shunt switches distributed along transmission lines to improve RF bandwidth as well as the signal isolation of the device. The shunt switches may be physically positioned on both sides of the transmission lines to keep an integrated circuit (IC) design essentially symmetrical so as to provide predictable and reliable operational characteristics. Some embodiments include stacked FET shunt switches and series switches to tolerate high voltages. In some embodiments, the gate resistor for each FET shunt switch is divided into two or more portions.

20 Claims, 6 Drawing Sheets

Related U.S. Application Data continuation-in-part of application No. 14/610,588, filed on Jan. 30, 2015, now Pat. No. 9,831,869.

(51) Int. Cl.
*H03K 17/693* (2006.01)
*H04B 1/44* (2006.01)
*H04B 1/00* (2006.01)

(56) References Cited

U.S. PATENT DOCUMENTS

| | | | |
|---|---|---|---|
| 4,978,932 A | 12/1990 | Gupta et al. | |
| 5,023,494 A * | 6/1991 | Tsukii | H01P 1/15 327/427 |
| 5,061,911 A * | 10/1991 | Weidman | H01P 1/15 333/104 |
| 5,159,297 A * | 10/1992 | Tateno | H01P 1/15 327/427 |
| 5,166,640 A | 11/1992 | Fathimulla et al. | |
| 5,180,998 A * | 1/1993 | Willems | H03H 11/20 327/237 |
| 5,202,657 A | 4/1993 | Stopper | |
| 5,412,347 A | 5/1995 | Minnis | |
| 5,990,580 A | 11/1999 | Weigand | |
| 7,167,687 B2 | 1/2007 | Kemmochi et al. | |
| 7,280,006 B2 * | 10/2007 | Hase | H01P 1/15 333/103 |
| 7,424,634 B2 | 9/2008 | Greeff et al. | |
| 7,482,892 B2 | 1/2009 | Tsai et al. | |
| 7,675,382 B2 | 3/2010 | Deng et al. | |
| 7,804,357 B2 | 9/2010 | Shigematsu | |
| 7,893,791 B2 | 2/2011 | Ma et al. | |
| 7,944,330 B2 | 5/2011 | Yamao et al. | |
| 8,103,221 B2 * | 1/2012 | Ta | H01P 1/15 333/101 |
| 8,482,360 B2 * | 7/2013 | Chang | H01P 1/15 333/103 |
| 8,570,025 B2 | 10/2013 | Heaney | |
| 9,048,898 B2 | 6/2015 | Han et al. | |
| 9,197,194 B2 | 11/2015 | Reedy et al. | |
| 9,537,472 B2 * | 1/2017 | Lu | H03K 5/08 |
| 9,685,946 B2 * | 6/2017 | Lu | H03K 17/687 |
| 9,742,400 B2 * | 8/2017 | Bakalski | H03K 17/693 |
| 9,831,869 B2 | 11/2017 | Lu et al. | |
| 2004/0070455 A1 | 4/2004 | Hong et al. | |
| 2007/0024389 A1 | 2/2007 | Mizutani | |
| 2007/0030101 A1 | 2/2007 | Mizutani | |
| 2010/0225378 A1 | 9/2010 | Nakatsuka et al. | |
| 2016/0226481 A1* | 8/2016 | Lu | H03K 17/002 |
| 2016/0226484 A1 | 8/2016 | Lu et al. | |
| 2017/0237418 A1* | 8/2017 | Lu | H03K 5/082 |

OTHER PUBLICATIONS

Hiltunen, Thomas J., Office Action received from the USPTO dated Nov. 25, 2016 for U.S. Appl. No. 14/995,023, 31 pgs.
Hiltunen, Thomas J., Notice of Allowance received from the USPTO dated Feb. 14, 2017 for U.S. Appl. No. 14/995,023, 23 pgs.
Lu, et al., Response filed in the USPTO dated Aug. 18, 2016 for U.S. Appl. No. 14/995,023, 12 pgs.
Lu, et al., Response filed in the USPTO dated Jan. 17, 2017 for U.S. Appl. No. 14/995,023, 16 pgs.
Lu, et al., Informal Amendment After AFCP 2.0 Interview filed in the USPTO dated Feb. 2, 2017 for U.S. Appl. No. 14/995,023, 9 pgs.
Nickitas-Etienne, Athina, Interanational Preliminary Report on Patentability received from the EPO dated Aug. 10, 2017, 7 pgs.

* cited by examiner

Distributed Shunt and Gate Design with Stacked Shunt Switches

FIG. 4A

Lumped Design with Stacked Shunt Switches

FIG. 4B

Stacked Series Switches

RADIO FREQUENCY SWITCHING CIRCUIT WITH DISTRIBUTED SWITCHES

CROSS REFERENCE TO RELATED APPLICATION—CLAIM OF PRIORITY

This application is a continuation of commonly owned and co-pending U.S. patent application Ser. No. 14/995,023 filed Jan. 13, 2016, entitled "Radio Frequency Switching Circuit with Distributed Switches", the disclosure of which is incorporated herein by reference in its entirety. Application Ser. No. 14/995,023 is a continuation-in-part of commonly owned and co-pending U.S. patent application Ser. No. 14/610,588 filed Jan. 30, 2015, entitled "Radio Frequency Switching Circuit with Distributed Switches", the disclosure of which is incorporated herein by reference in its entirety.

BACKGROUND

(1) Technical Field

This invention generally relates to electronic signal switching devices, and more specifically to electronic radio frequency signal switching devices.

(2) Background

Electronic signal switches are used in a wide variety of applications. One type of signal switch in common use is a field effect transistor (FET) that is actively controlled through a gate terminal to block or pass an electrical signal connected in series with source and drain terminals of the FET (in another mode of operation, a FET also may be used to modulate an electrical signal in response to a varying signal on the gate terminal).

Field effect transistors may be fabricated in various technologies (e.g., standard bulk silicon, silicon-on-insulator, silicon-on-sapphire, GaN HEMT, GaAs pHEMT, and MESFET processes) and are commonly represented in schematic diagrams as an idealized device. However, in many applications, particularly in radio frequency (RF) circuits, the structure and materials of a FET switch may have significant effects on its own operation (e.g., with respect to bandwidth, isolation, and power handling) and the presence of a FET switch may have significant effects on other components in a circuit. Such effects arise in part because a "CLOSED"/"ON" (low impedance) FET has a non-zero resistance, and an "OPEN"/"OFF" (high impedance) FET behaves as a capacitor due to parasitic capacitances arising from the proximity of various semiconductor structures, particularly within the close confines of an integrated circuit (IC). Large signal behaviors affecting power handling may also arise from other characteristics of a FET, such as avalanche breakdown, current leakage, accumulated charges, etc. Accordingly, the actual in-circuit behavior of a FET must be taken into account when designing FET based circuitry.

Figure 1A:
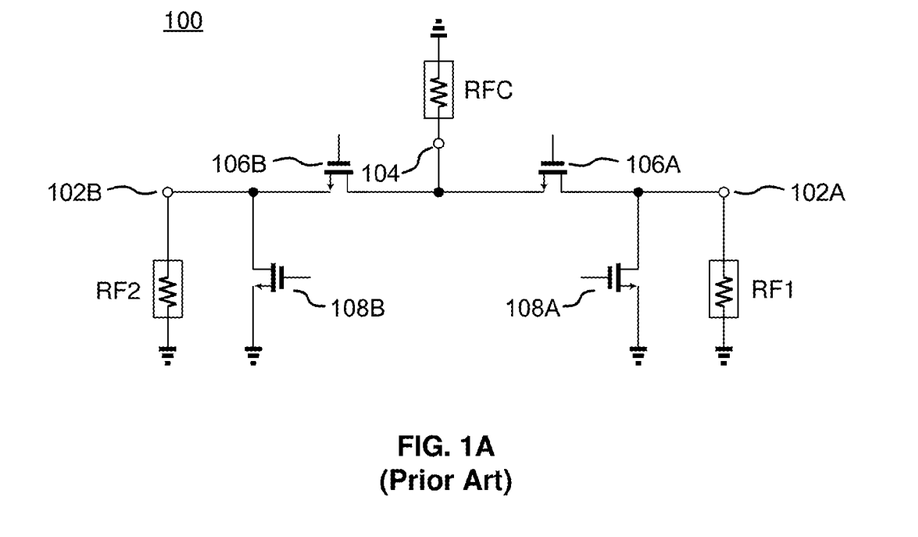
FIG. 1A is a schematic diagram of a prior art 3-port reflective signal switching device for selectively coupling one of two terminal ports to a common port.

One use of FET switches is within RF frequency signal switching devices. For example, FIG. 1A is a schematic diagram of a prior art 3-port reflective signal switching device 100 for selectively coupling one of two terminal ports 102A, 102B (shown series connected to respective external loads RF1, RF2) to a common port 104 (shown series connected to an external load RFC). Accordingly, the signal switching device 100 may be regarded as a single-pole, double-throw (SPDT) switch. In other configurations, more than two terminal ports (a 1×N switch) and more than one common port may be included (an M×N switch). Between the common port 104 and each terminal port 102A, 102B are respective FET series switches 106A, 106B; the FET series switches 106A, 106B may vary in size, for example, to accommodate different power levels. Between each terminal port 102A, 102B and its respective series switch 106A, 106B are respective FET shunt switches 108A, 108B, coupled to circuit ground. Such a switching device 100 may be used, for example, to selectively couple RF signals between two antennas respectively connected to the terminal ports 102A, 102B and transmit and/or receive circuitry connected to the common port 104. For RF signals, each load/source impedance RF1, RF2, RFC would typically have a nominal impedance of 50 ohms by convention.

In operation, when terminal port 102A is to be coupled to the common port 104, series switch 106A is set to a low impedance ON state by means of control circuitry (not shown) coupled to the gate of the FET series switch 106A. Concurrently, shunt switch 108A is set to a high impedance OFF state. In this state, signals can pass between terminal port 102A and the common port 104.

For the other terminal port 102B, the series switch 106B is set to a high impedance OFF state to decouple the terminal port 102B from the common port 104, and the corresponding shunt switch 108B is set to a low impedance ON state. One purpose of setting the shunt switch 108B to ON—thus coupling the associated terminal port 102B to circuit ground—is to improve the isolation of the associated terminal port 102B (and coupled circuit elements, such as antennas) through the corresponding series switch 106B. For switching devices with more than two terminal ports, the series switch and shunt switch settings for the "unused" (decoupled) terminal port to common port signal paths typically would be set to similar states.

Figure 1B:
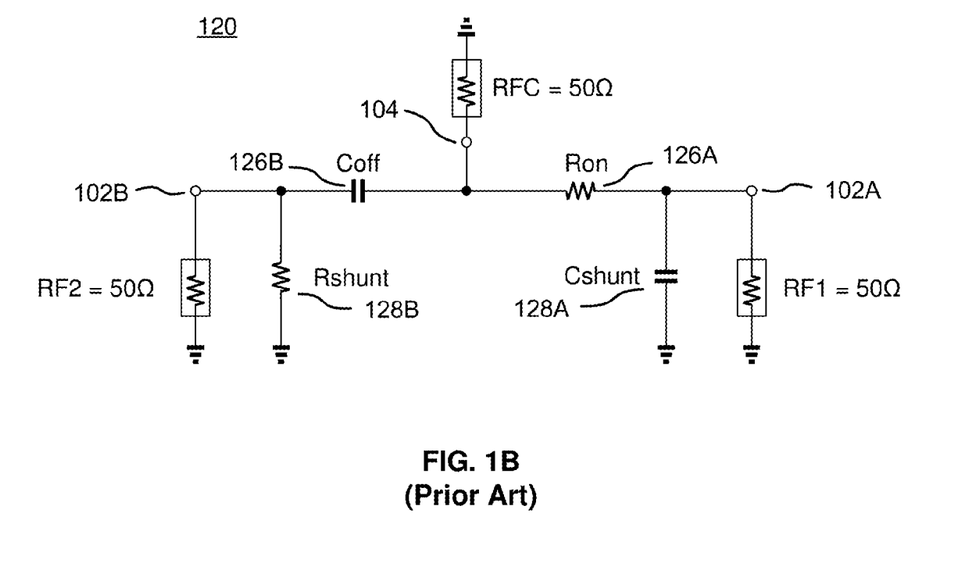
FIG. 1B is a diagram showing an equivalent circuit model of the prior art 3-port signal switching device of FIG. 1A.

FIG. 1B is a diagram showing an equivalent circuit model of the prior art 3-port signal switching device of FIG. 1A. Shown is a circuit configuration 120 in which terminal port 102A has been coupled to the common port 104; accordingly, series switch 106A and shunt switch 108B are set to a low impedance ON state, while series switch 106B and shunt switch 108A are set to a high impedance OFF state. In this configuration, series switch 106A is modeled as a resistor 126A having a resistance value of Ron (i.e., the CLOSED or ON state resistance of a FET), shunt switch 108A is modeled as a capacitor 128A having a capacitance of Cshunt (i.e., the OPEN or OFF state capacitance of a FET), series switch 106B is modeled as a capacitor 126B having a capacitance of Coff, and shunt switch 108B is modeled as a resistor 128B having a resistance value of Rshunt. As in FIG. 1A, with the illustrated circuit configuration, signals can pass between terminal port 102A and the common port 104.

Figure 1C:
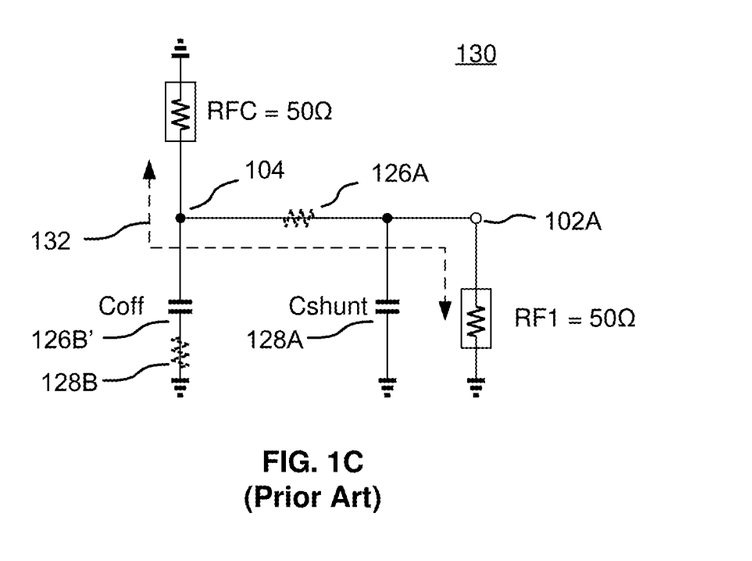
FIG. 1C is a diagram showing a simplified equivalent circuit model corresponding to the circuit configuration shown in FIG. 1B.

FIG. 1C is a diagram showing a simplified equivalent circuit model 130 corresponding to the circuit configuration 120 shown in FIG. 1B. Series switch 106B (modeled as a capacitor 126B in FIG. 1B) is OFF. The corresponding shunt switch 108B (modeled as a resistor 128B in FIG. 1B) is ON, thus having a very low impedance and coupling terminal port 102B to circuit ground. Since Rshunt has a very low impedance, the resistor equivalent 128B in FIG. 1B may be more simply modeled as a conductor (short) to circuit ground and is thus shown in dotted-line resistor form. Therefore, the two equivalent circuit elements 126B, 128B of FIG. 1B may be modeled as a single capacitor 126B' having a capacitance of Coff. Similarly, since series switch 106A (modeled as a resistor 126A in FIG. 1B) is ON and Ron is a very low impedance, series switch 106A may be more simply modeled as a conductor. Accordingly, the resistor equivalent 126A in FIG. 1B is shown in dotted-line resistor form, leaving OFF shunt switch 108A (modeled as a capacitor 128A with a capacitance of Cshunt) connected in parallel with the external load RF1. As in FIG. 1A and FIG. 1B, with the illustrated circuit configuration, signals can pass between terminal port 102A and the common port 104, as shown by dotted line signal path 132.

The simplified equivalent circuit model 130 can be used to evaluate the insertion loss (IL) bandwidth of the circuit model 130. In this example, the 3 dB IL bandwidth is proportional to 1/(Rport*(Coff+Cshunt)) [where Rport is the load resistance at the RF1 and RFC ports], which is typically limited to below 13 GHz in current silicon IC technology.

The bandwidth of conventional radio frequency switching devices of the type shown in FIGS. 1A, 1B, and 1C is limited by the parasitic capacitance from the Cshunt equivalent components. This invention in various embodiments addresses this limitation to improve the bandwidth of RF switching devices as well as the signal isolation and power handling of such switching devices.

SUMMARY OF THE INVENTION

Embodiments of the invention use distributed shunt switches distributed along transmission lines (or may include other inductive impedance compensating components) to improve RF bandwidth with respect to insertion loss, and to improve isolation. In addition, the shunt switches may be physically positioned on both sides of the transmission lines to keep an integrated circuit (IC) design essentially symmetrical so as to provide predictable and reliable operational characteristics. Some embodiments include stacked FET shunt switches and series switches to tolerate high voltages. In some embodiments, the gate resistor for each FET shunt switch is divided into two or more portions to save IC area near the transmission lines, or to optimize a performance parameter, such as power handling, isolation, or low frequency behavior.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

The bandwidth of conventional radio frequency (RF) switching devices of the type shown in FIGS. 1A, 1B, and 1C is limited by the parasitic capacitance from the Cshunt equivalent components. Embodiments of the invention use distributed shunt switches distributed along transmission lines (or may include other inductive impedance compensating components) to improve RF bandwidth with respect to insertion loss, and to improve isolation. In addition, the shunt switches may be physically positioned on both sides of the transmission lines to keep an integrated circuit (IC) design essentially symmetrical so as to provide predictable and reliable operational characteristics. Some embodiments include stacked FET shunt switches and series switches to tolerate high voltages. In some embodiments, the gate resistor for each FET shunt switch is divided into two or more portions to save IC area near the transmission lines, or to optimize a performance parameter, such as power handling, isolation, or low frequency behavior.

Distributed Shunt Switches

Figure 2A:
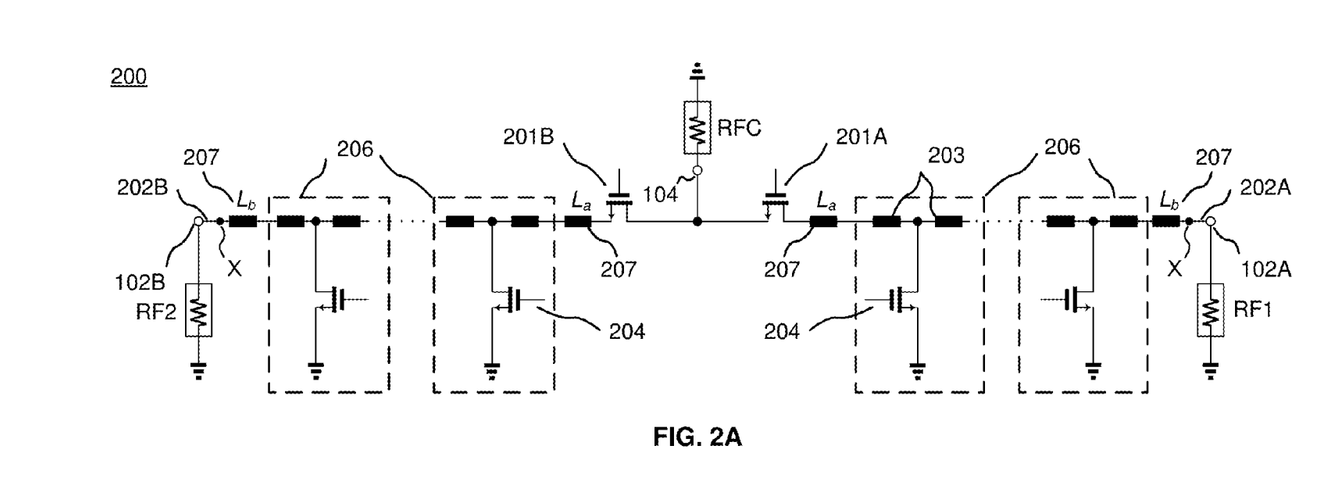
FIG. 2A is a schematic diagram of a 3-port signal switching device for selectively coupling one of two terminal ports to a common port in accordance with the teachings of this disclosure.

FIG. 2A is a schematic diagram of a 3-port signal switching device 200 for selectively coupling one of two terminal ports 102A, 102B (shown series connected to respective external loads RF1, RF2) to a common port 104 (shown series connected to an external load RFC) in accordance with the teachings of this disclosure. Accordingly, the illustrated signal switching device 200 may be regarded as a single-pole, double-throw (SPDT) switch.

Between the common port 104 and each terminal port 102A, 102B are respective primary isolation FET series switches 201A, 201B that operate in essentially the same fashion as the corresponding series switches 106A, 106B in FIG. 1A. In other configurations, only one terminal port may be used (e.g., only terminal port 102A in a single-pole, single-throw switch), more than two terminal ports may be included (e.g., a 1×N switch), and more than one common port may be included (e.g., an M×N matrix switch). When three or more terminal ports are included (e.g., 102A, 102B, and a similar third port not shown), the switching device 200 may be utilized as a transfer switch, allowing a signal to be communicated from any one port to any other port while isolating unused ports from the signal path (the common port 104 is not used in such a case unless an isolation serial switch to the signal path is interposed). Further, the FET series switches 201A, 201B may be of different sizes in some embodiments. The illustrated embodiment may be advantageously embodied on a silicon-on-insulator (SOI) integrated circuit (IC) substrate.

An important aspect of the disclosed embodiments is that inductive tuning components are included to compensate for the OFF state capacitance Cshunt of the shunt switch units 204 described below. One way to provide such inductive tuning components is to use a transmission line that includes at least one series inductive component coupled to at least one shunt capacitive component. In the embodiment illustrated in FIG. 2A, each of the FET series switches 201A, 201B is coupled to a corresponding transmission line 202A, 202B that can be modeled as a plurality of series-coupled inductive tuning components 203 (depicted as rectangular symbols in this example). Each transmission line 202A, 202B may be implemented, for example, as microstrips or coplanar waveguides. For RF switching devices, the transmission lines 202A, 202B would typically be tuned to have a nominal impedance of 50 ohms by convention. The individual shunt switches 108A, 108B shown in FIG. 1A have each been replaced by sets of n (where n≥1) parallel FET shunt switch units 204. The shunt switch units 204 may be reduced in size compared to a conventional single shunt switch 108A, 108B.

Figure 2B:
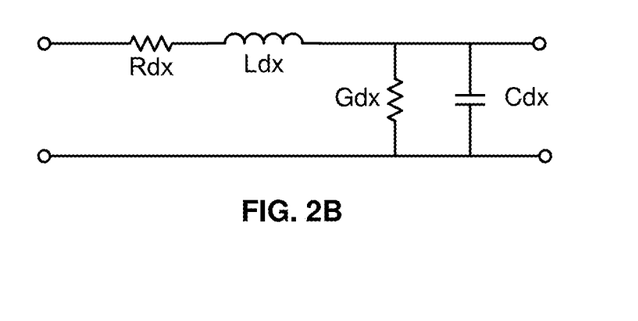
FIG. 2B is a schematic representation of an elemental length of a transmission line.

FIG. 2B is a schematic representation of an elemental length of a transmission line, where Rdx, Ldx, Gdx, and Cdx, are respectively, the per unit length resistance, inductance, conductance, and capacitance of the line. The impedance Zo of such a transmission line is Zo=√(Ldx/Cdx). The OFF state capacitance Cshunt of the shunt switches units 204 is in parallel with Cdx. To achieve compensation of Cshunt of the shunt switches units 204, Ldx can be increased, or Cdx can be decreased, or both, with respect to each other, so that √(Ldx/(Cdx+Cshunt))=Zo (commonly specified as 50 ohms by convention).

In the illustrated embodiment, the conduction (source-drain) channel of each FET shunt switch unit 204 is coupled to circuit ground and between a corresponding pair of inductive tuning components 203, thereby forming an elemental length of a transmission line 206, examples of which are shown bounded by dotted boxes. In some embodiments, an inductive tuning component 203 may be shared between adjacent shunt switch units 204, thus constituting part of two elemental lengths of a transmission line. However, for purposes of circuit analysis, it may be easier to model a shared inductive tuning component 203 as being "split" between adjacent shunt switch units 204.

As more fully explained below, the primary series switches 201A, 201B and the shunt switch units 204 may be replaced by multiple series-coupled FET switches to tolerate higher voltages than a single FET switch. Such "stacking" of FET switches helps decrease the effective Cshunt while permitting higher power handling.

Additional supplemental inductive tuning components 207 (also labeled $L_a$ and $L_b$) may be added at either end or both ends of the transmission lines 202A, 202B to enable fine tuning of parasitics unrelated to the transmission lines 202A, 202B, such as the series switch device parasitic capacitances and pad capacitance for I/O interconnects. The values for the supplemental inductive tuning components 207 ($L_a$, $L_b$) of one transmission line may be the same or different with respect to each other, and with respect to the supplemental inductive tuning components 207 ($L_a$, $L_b$) of other transmissions lines. In addition, in some applications, it may be useful to insert an additional secondary isolation series FET switch in series with the transmission line signal path at each node marked "X" in FIG. 2A and FIG. 2C, making the circuit appear more symmetrical electrically. By opening the primary and secondary series FET switches at both ends of a transmission line (e.g., 202B) associated with an unused terminal port (e.g., 102B), that transmission line will be fully isolated from any circuitry attached to such ends. The secondary isolation series FET switches may be the same size as the primary isolation series switches 201A, 201B, but equal sizing is not required to still provide benefit. For example, modeling has shown that there may be a benefit to having different sizes for the secondary isolation series FET switches relative to the primary isolation series FET switches. In general, adding secondary isolation series FET switches would most frequently apply to switching devices having two or more terminal ports, but may also be applied to switching devices having a single terminal port (e.g., a SPST switch) when there may be some aspect of the external circuit element being switched where having more isolation on both sides of the transmission line signal path is helpful (e.g., when using an SPST embodiment in a shunt configuration to circuit ground).

In operation, when terminal port 102A is to be coupled to the common port 104, series switch 201A is set to a low impedance ON state by means of control circuitry (not shown) coupled to the gate of the FET series switch 201A. Concurrently, the set of n shunt switch units 204 coupled to transmission line 202A is set to a high impedance OFF state. In this state, signals can pass between terminal port 102A and the common port 104 along transmission line 202A.

For the other terminal port 102B in this example, the series switch 201B is set to a high impedance OFF state to decouple transmission line 202B and the terminal port 102B from the common port 104, and the set of n corresponding shunt switch units 204 coupled to transmission line 202B is set to a low impedance ON state, thus coupling the associated terminal port 102B to circuit ground.

Figure 2C:
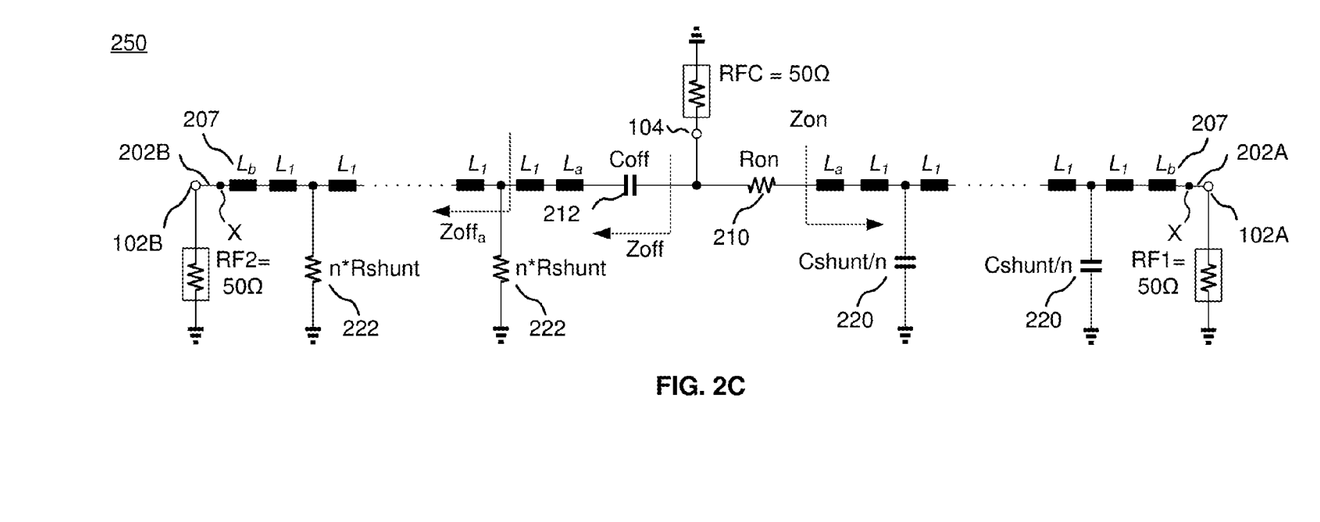
FIG. 2C is a diagram showing an equivalent circuit model of the 3-port signal switching device of FIG. 2A.

FIG. 2C is a diagram showing an equivalent circuit model of the 3-port signal switching device of FIG. 2A. Shown is a circuit configuration 250 in which terminal port 102A has been coupled to the common port 104, as described with respect to FIG. 2A. In this configuration, series switch 201A is modeled as a resistor 210 having a resistance value of Ron, and series switch 201B is modeled as a capacitor 212 having a capacitance of Coff. The shunt switch units 204 coupled to transmission line 202A are each shown modeled as capacitances 220 with a capacitance of Cshunt/n. The shunt switch units 204 coupled to transmission line 202B are each shown modeled as resistances 222 with a resistance of Rshunt*n.

As in FIG. 2A, with the illustrated circuit configuration 250, signals can pass between terminal port 102A and the common port 104. For RF signals, each load RF1, RF2, RFC would typically have a nominal impedance of 50 ohms by convention. Each of the inductive tuning components 203, 207 in FIG. 2A has a corresponding inductance, $L_a$, $L_b$, or $L_1$, as shown in FIG. 2C and described below. Values for the inductive tuning components 203 may be selected to achieve compensation of Cshunt of the shunt switches units 204 as described above. Values for the supplemental inductive tuning components 207 ($L_a$, $L_b$) may be selected to achieve compensation of Coff and the impedance (Zoff$_a$, described below) of the OFF signal path, and for parasitics associated with signal interconnections.

Benefits of the embodiment illustrated in FIG. 2A and FIG. 2C include (1) tuning out the effect of Coff; (2) tuning out the effect of C shunt; and (3) improving isolation of OFF paths.

(1) Tuning Out the Effect of Coff

For the configuration shown in FIG. 2A, the impedance Zoff of the OFF path (i.e., all of the elements from series switch 201B through load RF2, as indicated by the dotted "Zoff" line in FIG. 2C) is given by the following formula:

$$Zoff = j\omega(L_a + L_1) + 1/j\omega Coff + Zoff_a \qquad [\text{Eq. 1}]$$

where $Zoff_a$ comprises the impedance of the OFF path after the first $L_1$ inductive tuning component through load RF2 (as indicated by the dotted "$Zoff_a$" line in FIG. 2C) and whose value approaches n*Rshunt at higher frequencies.

The resonant frequency of the Zoff impedance is $$\frac{1}{2\pi\sqrt{(L_a + L_1)\ Coff}}.$$

When Zoff is below its resonant frequency $$\left(\text{i.e., } jw(L_a + L_1) < \left|\frac{1}{j\omega Coff}\right|\right),$$

achieved by selection of the values for the inductive tuning components 203 for a particular application, then the loading effect of the Coff capacitance on the ON path (i.e., all of the elements from series switch 201A through load RF1) is appreciably reduced, thus improving the bandwidth of the switching device 200 compared with conventional designs. This characteristic can be used to improve the design trade-off between bandwidth, insertion loss, and isolation for all such switching devices.

(2) Tuning Out the Effect of Cshunt

For the configuration shown in FIG. 2A, with respect to the ON path, the impedance Zon for the ON path (as indicated by the dotted "Zon" line) is given by the following formula:

$$Zon = \sqrt{\frac{2*L_1}{Cshunt/n}} \quad [\text{Eq. 2}]$$

The cutoff frequency (half power point), $f_c$, is given by the following formula:

$$f_c = \frac{1}{2\pi\sqrt{2*L_1 * \frac{Cshunt}{n}}} \quad [\text{Eq. 3}]$$

Figure 3:
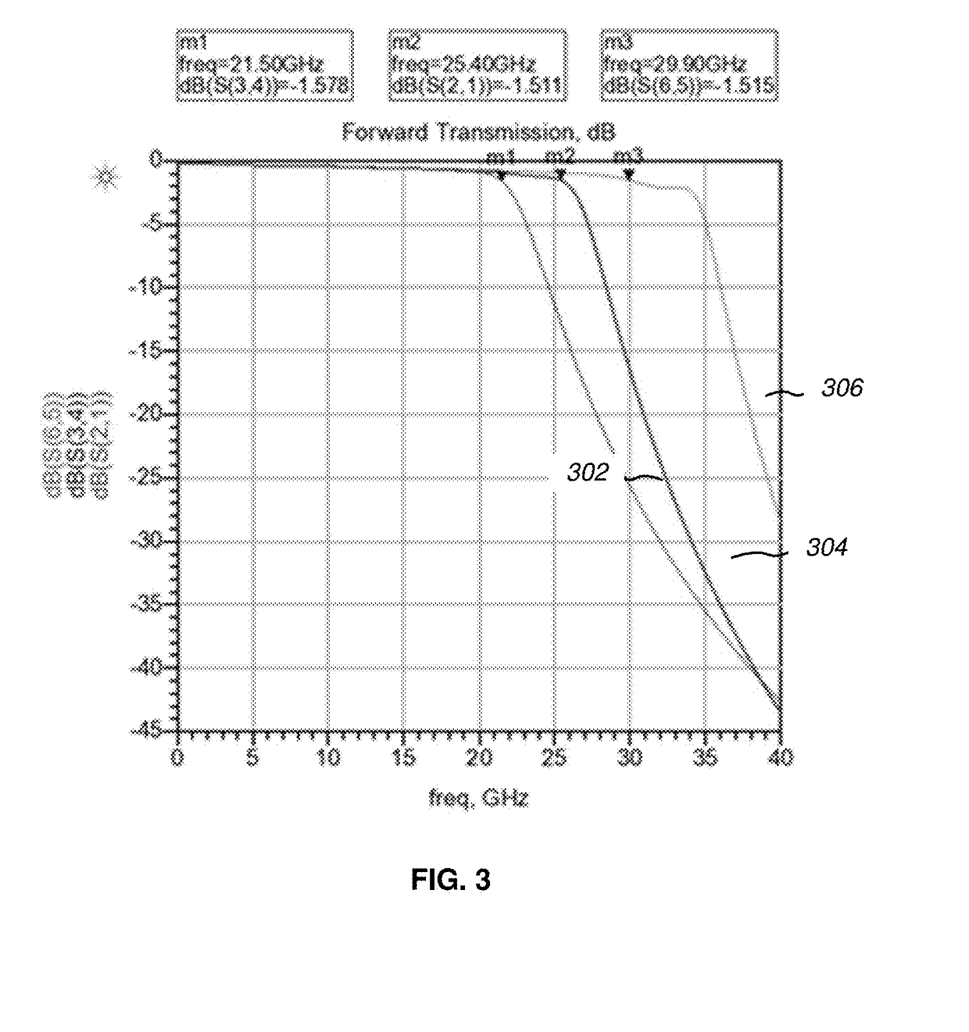
FIG. 3 is a graph showing simulation results of three variations of a switching device in accordance with FIG. 2A.

Accordingly, the half power point (3 dB) bandwidth of Zon is related to $L_1$, n, and Cshunt, and can be adjusted by adding additional tuning network stages 206 (i.e., increasing n). The corresponding value of $L_1$ is then determined by Eq. 2 to maintain a constant Zon. As deduced from Eq. 2, as n is increased, the corresponding value of $L_1$ is decreased proportional to 1/n. In particular, the higher the number n of tuning networks 206, the higher the cutoff frequency. For example, FIG. 3 is a graph showing simulation results of three variations of a switching device in accordance with FIG. 2A, with n=4, 5, or 6 while keeping the total transmission line 202A length and the total Cshunt capacitance the same. Utilizing a more conservative power point before insertion loss begins to significantly decline, the 1.5 dB bandwidth (indicated by corresponding markers m1, m2, and m3) for the three circuit variations improved from 21.5 GHz (n=4, see line 302) to 25.4 GHz (n=5, see line 304) to 29.9 GHz (n=6, see line 306) as n increased.

Further, working with equations Eq. 2 and Eq. 3, the value of Cshunt can be expressed in terms of the desired Zon, $f_c$, and number of networks n as follows:

$$Cshunt = \frac{n}{2\pi f_c * Zon} \quad [\text{Eq. 4}]$$

Therefore, the maximum Cshunt can be calculated for a set of targeted parameters. As an example, for a Zon of 50 Ohms, a cutoff frequency of 60 GHz, and n=6 for the number of tuning networks 206, results in Cshunt=318 fF, Cshunt/n=53 fF, and $L_1$=66 pH.

(3) Improving Isolation of OFF Paths

For the configuration shown in FIG. 2A, as noted above, the higher the number n of shunt switch units 204 and corresponding inductive tuning components 203 (i.e., tuning networks 206), the higher the cutoff frequency. In addition, as n increases, the higher the number of LR low pass filter stages there are in the OFF path, and accordingly the isolation of the OFF path (from RFC to RF2) is improved compared to conventional designs.

Stacked Switch Structures

Figure 4A:
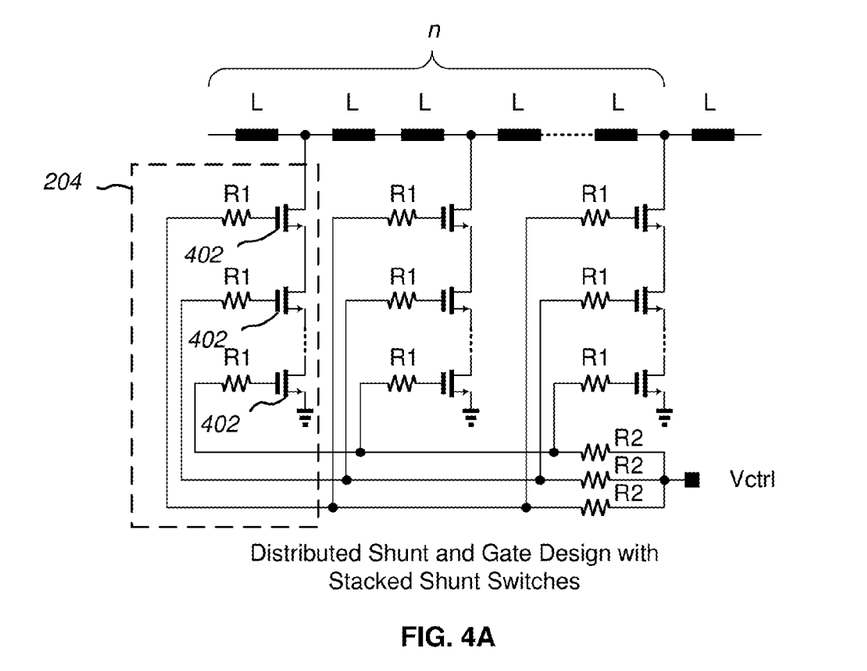
FIG. 4A is a schematic diagram of a circuit architecture having distributed stacked shunt switches as well as distributed gate resistors.

As mentioned above, each of the shunt switch units 204 and the series switches 201A, 201B may be replaced by multiple series-coupled FET switches. This type of "stacked" architecture allows a circuit to tolerate higher voltages than a single FET switch. For example, FIG. 4A is a schematic diagram of a circuit architecture having distributed stacked shunt switches as well as distributed gate resistors (the gate resistor aspect is discussed below). In this example, each of the n shunt switch units 204 of FIG. 2A has been replaced by a series-coupled stack of m FET switches 402, where m≥2.

Figure 4B:
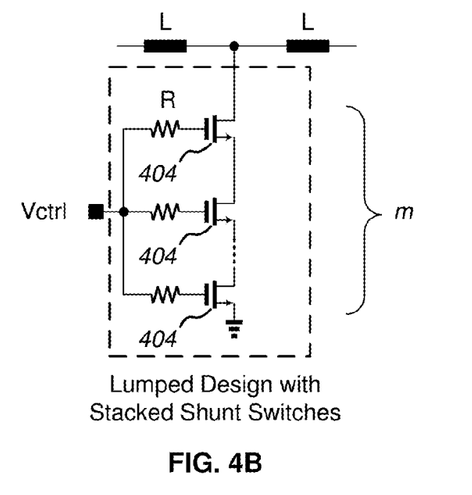
FIG. 4B is a schematic diagram of a circuit architecture having lumped stacked shunt switches.

For some embodiments that may not require distributed shunt switches, a lumped design with stacked shunt switches may be used. For example, FIG. 4B is a schematic diagram of a circuit architecture having lumped stacked shunt switches. In this example, the n shunt switch units 204 of FIG. 2A has been replaced by a single series-coupled stack of m FET switches 404.

Figure 5:
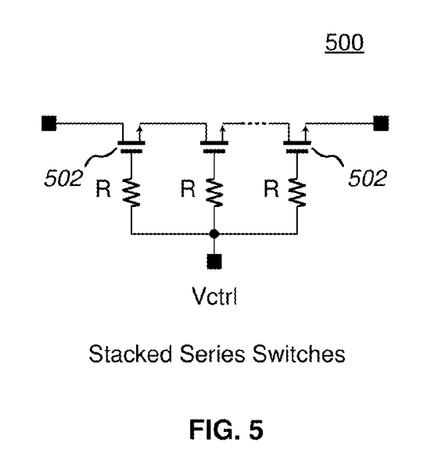
FIG. 5 is a schematic diagram of a circuit architecture having stacked series switches.

The series switches 201A, 201B shown in FIG. 2A may also be implemented as stacked switches. For example, FIG. 5 is a schematic diagram of a circuit architecture 500 having stacked series switches. One or more of the series switches 201A, 201B shown in FIG. 2A would be replaced by two or more FET switches 502 configured as a series-coupled stack.

Symmetrical Layout

The switching device architecture shown in FIG. 2A can be advantageously combined with the stacked switch circuits shown in FIG. 4A, FIG. 4B, and/or FIG. 5 to provide a distributed stacked FET-switch based switching device that provides for approximately even electromagnetic field distribution around the transmission lines 202A, 202B, and provides for a better ground return.

Figure 6:
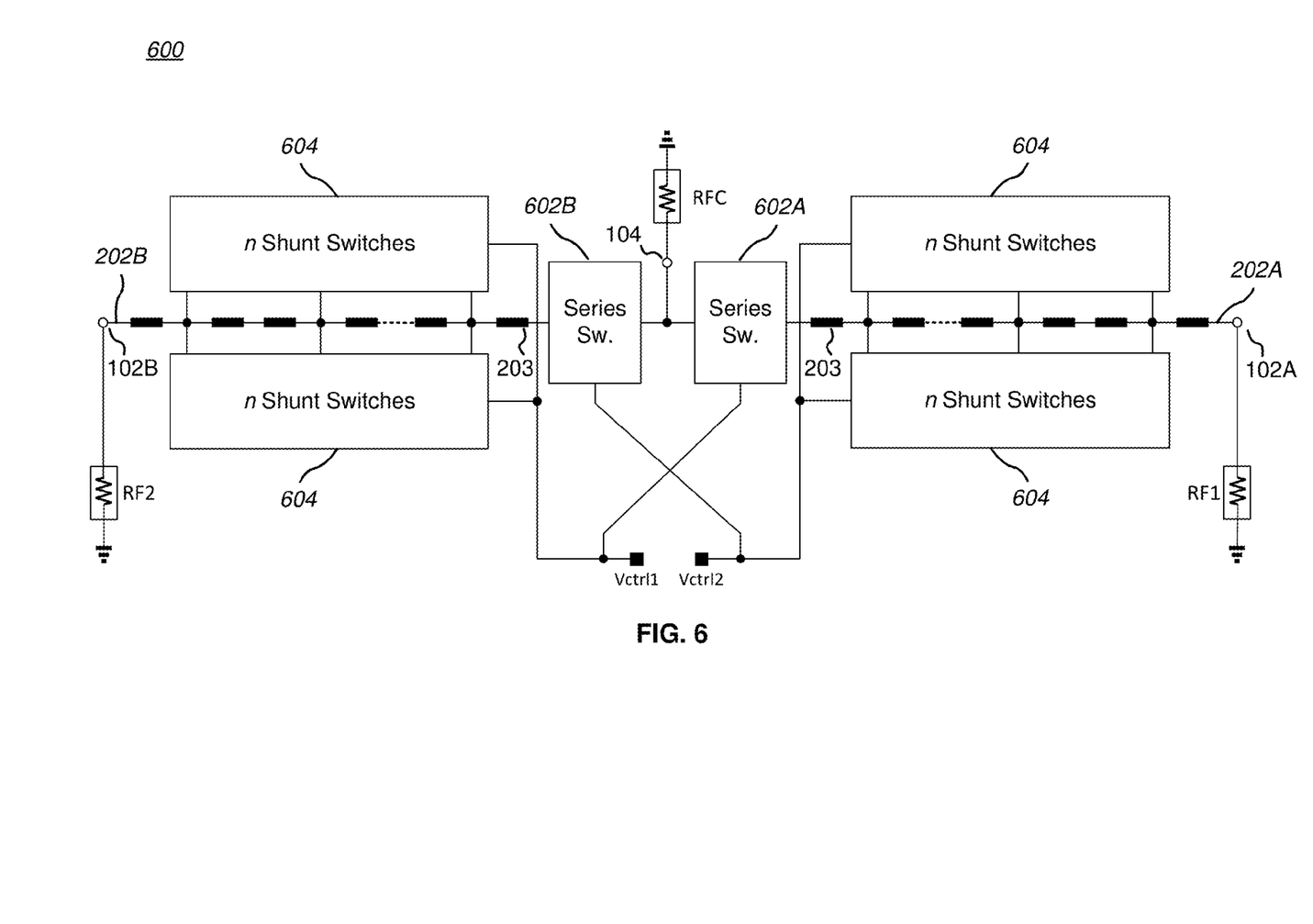
FIG. 6 is a diagram of a conceptual circuit layout of an RF switching circuit with distributed stacked switches for both the shunt and series switch components.

For example, FIG. 6 is a diagram of a conceptual circuit layout of an RF switching circuit 600 with distributed switches (which may be stacked switches) for both the shunt and series switch components. In the illustrated embodiment, two terminal ports 102A, 102B (shown series connected to respective external loads RF1, RF2) are connectable to a common port 104 (shown series connected to an external load RFC) through corresponding transmission lines 202A, 202B and series switches 602A, 602B. The series switches 602A, 602B may be single FET switches as shown in FIG. 2A, or a stack of FET switches as shown in FIG. 5. As in FIG. 2A and FIG. 2C, the transmission lines 202A, 202B each include a plurality of inductive tuning components 203, and, optionally, supplemental inductive tuning components 207 (not shown).

Coupled to the transmission lines 202A, 202B are sets of n shunt switches 604, each of which may be configured as shown in FIG. 2A (distributed), FIG. 4A (stacked distributed), or FIG. 4B (lumped distributed); in each configuration, there is an internal connection to circuit ground (not shown in FIG. 6). As discussed above, a configuration with n shunt switch units alone or in conjunction with control of the inductance values of the inductive tuning components 203, 207 gives control over the cutoff frequency of the switching circuit 600, provides the ability to tune out the effects of Cshunt and Coff, and improves isolation of OFF paths. In addition, by using a stack of m FET switches for each of the n shunt switch units, higher voltage levels can be tolerated.

Importantly, in the configuration shown in FIG. 6, the sets of shunt switches 604 are physically placed on both sides of the transmission lines 202A, 202B, and the transmission lines 202A, 202B are arrayed on an IC layout in a substantially symmetrical manner. Such placement of the sets of shunt switches 604 provides for approximately even electromagnetic field distribution around the transmission lines 202A, 202B and provides for a better ground return because of the multiple connections to circuit ground; both characteristics are useful when designing absorptive switches. In addition, such physical distribution improves the thermal characteristics of the switching device 600 by spacing apart the FET switches, thus reducing the areal concentration of power-consuming circuit elements.

As noted above, in other configurations, only one terminal port may be used (e.g., a single-pole, single-throw switch), more than two terminal ports may be included (e.g., a 1×N switch), and more than one common port may be included (e.g., an M×N matrix switch). Accordingly, fewer or additional transmission lines may be arrayed on an IC layout in a substantially symmetrical manner as needed to accommodate fewer or additional ports, with associated sets of shunt switches 604 physically placed on both sides of the added transmission lines.

Gate Resistance Area Reduction

In general, FET switches require a gate resistor to limit the instantaneous current that is drawn when the FET is turned on, to control the switch ON and OFF times, and in general to maintain electromagnetic integrity. In conventional IC FET designs, a gate resistor is physically located in close proximity to the gate of the transistor. However, when implementing a distributed shunt switch of the type shown in FIG. 4A, each FET shunt switch unit 204 is n times smaller than in a lumped design. Accordingly, to maintain the same low frequency characteristics, the gate resistor value for each FET shunt switch unit 204 must be n times larger than in a lumped design. Further, each FET shunt switch unit 204 may include m FET switches 402. In such a configuration, since there are m stacked elements per shunt switch unit 204, the total size for all of the gate resistors is m*n times bigger in area than in a lumped design.

To reduce the total size of the needed gate resistance, in some embodiments a FET gate resistor can be split into two sections. Referring again to FIG. 4A, each of the FET switches 402 includes a small primary resistance R1 (e.g., about from 1,000 to 1,000,000 ohms) that is placed in close proximity to the gate of each FET to take care of needed electromagnetic integrity. A larger secondary resistance R2 (e.g., about from 10,000 to 10,000,000 ohms) is then placed on a common path series coupled to multiple instances of the small primary resistance R1 (e.g., each of the n FET shunt switch units 204) to maintain desired low frequency characteristics, but may be physically located away from close proximity to the small primary resistances R1 (and hence from the gate of each FET). The values for R1 and R2 are set such that $R1/n + R2 = R$, where R is the total gate resistance needed for a particular circuit design. Such values may be empirically determined by experiment or simulation for frequencies of interest. Because the larger secondary resistances R2 are shared over a number of FET switches, the total area needed for integrated circuit fabrication will be reduced in scale by the ratio of R1 to R2. As should be apparent, each primary resistance R1 and secondary resistance R2 may comprise two or more actual resistive elements.

Methods

Another aspect of the invention includes a method for configuring a radio frequency switching device, including the steps of:

STEP 1: providing at least one common port;

STEP 2: providing at least one field effect transistor (FET) series switch, each coupled to at least one common port;

STEP 3: providing at least one transmission line, each coupled to a respective FET series switch, each transmission line including at least one series-coupled inductive tuning component;

STEP 4: providing at least one terminal port, each coupled to a respective transmission line; and STEP 5: providing, for each transmission line, at least one FET shunt switch unit coupled to circuit ground and to such transmission line in a tuning network configuration.

A further aspect of the invention includes a method for configuring a radio frequency switching device, including the steps of:

STEP 1: providing at least one common port;

STEP 2: coupling at least one field effect transistor (FET) series switch to at least one common port;

STEP 3: coupling at least one transmission line to a respective FET series switch, each transmission line including at least one series-coupled inductive tuning component;

STEP 4: coupling at least one terminal port to a transmission line; and

STEP 5: coupling at least one FET shunt switch unit to circuit ground and to each such transmission line in a tuning network configuration.

The described method can be extended to include physically positioning pairs of the FET shunt switch units on both sides of each of the at least one transmission line; arraying the at least one transmission line on an integrated circuit layout in a substantially symmetrical manner; configuring at least one FET shunt unit as a series-coupled stack of FET switches; configuring at least one FET series switch as a series-coupled stack of FET switches; coupling at least one primary resistor to a gate of each FET in the FET shunt unit in close proximity to such gate, and providing a plurality of secondary resistors each series coupled to the primary resistors of two or more FETs but located farther away from the gate of each such FET than the primary resistors coupled to each such gate; coupling at least one secondary isolation FET series switch between a respective one of the at least one transmission line and a respective one of the at least one terminal port; and fabricating the described circuitry as an integrated circuit.

As should be readily apparent to one of ordinary skill in the art, various embodiments of the invention can be implemented to meet a wide variety of specifications. Thus, selection of suitable component values are a matter of design choice unless otherwise noted. The switching and passive elements may be implemented in any suitable integrated circuit (IC) technology, including but not limited to MOS- FET and IGFET structures. Integrated circuit embodiments may be fabricated using any suitable substrates and processes, including but not limited to standard bulk silicon, silicon-on-insulator (SOI), silicon-on-sapphire (SOS), GaAs pHEMT, and MESFET processes. Voltage levels may be adjusted or voltage polarities reversed depending on a particular specification and/or implementing technology (e.g., NMOS, PMOS, or CMOS). Component voltage, current, and power handling capabilities may be adapted as needed, for example, by adjusting device sizes, "stacking" components to tolerate greater voltages (including as described above), and/or using multiple components in parallel to tolerate greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

What is claimed is:

1. A radio frequency switching device including:
    (a) at least one common port;
    (b) at least one field effect transistor (FET) series switch, each coupled to at least one common port;
    (c) at least one terminal port;
    (d) at least one transmission line, the ends of each transmission line being series coupled between a respective one of the at least one FET series switch and a respective one of the at least one terminal port; and
    (e) for at least one such transmission line, at least two FET shunt switch units coupled between circuit ground and such transmission line in a tuning network configuration, wherein each FET of the at least two FET shunt switch units includes a primary resistor coupled to a gate of such FET in close proximity to such gate, and further including at least one secondary resistor each series coupled to the primary resistor of two or more of such FETs but located farther away from the gate of each such FET than the primary resistor coupled to each such gate.

2. The invention of claim 1, wherein each transmission line is arrayed on an integrated circuit so as to define a first side and a second side of such transmission line and at least two FET shunt switch units are positioned with respect to at least one arrayed transmission line such that at least one such FET shunt switch unit is positioned adjacent the first side of such arrayed transmission line and at least one other FET shunt switch unit is positioned adjacent the second side of such arrayed transmission line.

3. The invention of claim 1, wherein at least one transmission line is arrayed on an integrated circuit layout in a substantially symmetrical manner.

4. The invention of claim 1, wherein at least one FET shunt switch unit includes a series-coupled stack of FET switches.

5. The invention of claim 1, wherein at least one FET series switch includes a series-coupled stack of FET switches.

6. The invention of claim 1, wherein at least one transmission line further includes at least one coupled supplemental inductive tuning component.

7. The invention of claim 1, wherein each FET shunt switch unit has an OFF state capacitance, and the tuning network configuration compensates for the OFF state capacitance.

8. The invention of claim 1, further including at least one secondary isolation FET series switch, each coupled between a respective one of the at least one transmission line and a respective one of the at least one terminal port.

9. The invention of claim 1, wherein the radio frequency switching device is embodied on a silicon-on-insulator integrated circuit substrate.

10. A radio frequency switching device including:
    (a) at least one common port;
    (b) at least one field effect transistor (FET) series switch, each coupled to at least one common port;
    (c) at least one terminal port;
    (d) at least one transmission line, the ends of each transmission line being series coupled between a respective one of the at least one FET series switch and a respective one of the at least one terminal port, each transmission line including one or more compensating inductance elements; and
    (e) for each transmission line, at least two FET shunt switch units coupled between circuit ground and such one or more compensating inductance elements in a tuning network configuration, wherein each FET shunt switch unit has an OFF state capacitance and the tuning network configuration compensates for such OFF state capacitance, and wherein each FET of the at least two FET shunt switch units includes a primary resistor coupled to a gate of such FET in close proximity to such gate, and further including at least one secondary resistors each series coupled to the primary resistor of two or more of such FETs but located farther away from the gate of each such FET than the primary resistor coupled to each such gate.

11. A method for configuring a radio frequency switching device, including the steps of:
    (a) providing at least one common port;
    (b) coupling at least one field effect transistor (FET) series switch to at least one common port;
    (c) coupling a first end of at least one transmission line to a respective one of the at least one FET series switch, each transmission line including at least one series-coupled inductive tuning component;
    (d) coupling at least one terminal port to a second end of a respective one of the at least one transmission line; and
    (e) coupling at least two FET shunt switch units between circuit ground and a corresponding one of the at least one transmission line in a tuning network configuration, wherein each FET of the at least two FET shunt switch units includes a primary resistor coupled to a gate of such FET in close proximity to such gate; and
    (f) coupling at least one secondary resistor in series to the primary resistor of two or more FETs, wherein each secondary resistor is located farther away from the gate of each such coupled FET than the primary resistor coupled to each such gate.

12. The method of claim 11, further including:
    (a) arraying each transmission line on an integrated circuit so as to define a first side and a second side of such transmission line;

(b) for at least one arrayed transmission line, positioning at least two FET shunt switch units such that at least one such FET shunt switch unit is positioned adjacent the first side of such arrayed transmission line and at least one other FET shunt switch unit is positioned adjacent the second side of such arrayed transmission line.

13. The method of claim 11, further including arraying at least one transmission line on an integrated circuit layout in a substantially symmetrical manner.

14. The method of claim 11, wherein at least one FET shunt unit includes a series-coupled stack of FET switches.

15. The method of claim 11, wherein at least one FET series switch includes a series-coupled stack of FET switches.

16. The method of claim 11, further including coupling at least one supplemental inductive tuning component to at least one transmission line.

17. The method of claim 11, wherein each FET shunt switch unit has an OFF state capacitance, and the tuning network configuration compensates for the OFF state capacitance.

18. The method of claim 11, further including coupling at least one secondary isolation FET series switch between a respective one of the at least one transmission line and a respective one of the at least one terminal port.

19. The method of claim 11, further including embodying the radio frequency switching device on a silicon-on-insulator integrated circuit substrate.

20. A method for configuring a radio frequency switching device, including the steps of:
(a) providing at least one common port;
(b) coupling at least one field effect transistor (FET) series switch to at least one common port;
(c) coupling a first end of at least one transmission line to a respective one of the at least one FET series switch, each transmission line including one or more compensating inductance elements;
(d) coupling at least one terminal port to a second end of a respective one of the at least one transmission line;
(e) coupling at least two FET shunt switch units to a corresponding one of the at least one transmission line, wherein each FET shunt switch unit is coupled between circuit ground and such one or more compensating inductance elements of such at least one transmission line in a tuning network configuration, wherein each FET shunt switch unit has an OFF state capacitance and the tuning network configuration compensates for such OFF state capacitance, and wherein each FET switch of the at least two FET shunt switch units includes a primary resistor coupled to a gate of such FET switch in close proximity to such gate and
(f) coupling at least one secondary resistor in series to the primary resistor of two or more FET switches, wherein each secondary resistor is located farther away from the gate of each such coupled FET switch than the primary resistor coupled to each such gate.

* * * * *